United States Patent
Wang et al.

(10) Patent No.: US 6,506,994 B2
(45) Date of Patent: Jan. 14, 2003

(54) LOW PROFILE THICK FILM HEATERS IN MULTI-SLOT BAKE CHAMBER

(75) Inventors: Yen-Kun Victor Wang, Fremont, CA (US); Mark Fodor, Los Gatos, CA (US); Chen-An Chen, Milipitas, CA (US); Himanshu Pokharna, San Jose, CA (US); Son T. Nguyen, San Jose, CA (US); Kelly Fong, San Francisco, CA (US); Inna Shmurun, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/882,769

(22) Filed: Jun. 15, 2001

(65) Prior Publication Data

US 2002/0190051 A1 Dec. 19, 2002

(51) Int. Cl.$^7$ .................................. F27B 5/14
(52) U.S. Cl. ..................... 219/39; 219/395; 219/411; 392/418; 118/728; 438/799; 165/58
(58) Field of Search ................. 219/385, 390, 219/395, 405, 411, 446.1, 447.7, 449.1, 466.1, 468.1; 392/416, 418; 118/50.1, 724, 725, 728, 729; 438/799; 432/121–122, 152; 165/58, 61

(56) References Cited

U.S. PATENT DOCUMENTS

| | | | |
|---|---|---|---|
| 4,872,938 A | | 10/1989 | Davis et al. |
| 5,225,663 A | * | 7/1993 | Matsumura et al. ........ 219/543 |
| 5,228,501 A | | 7/1993 | Tepman et al. |
| 5,531,835 A | | 7/1996 | Fodor et al. |
| 5,633,073 A | | 5/1997 | Cheung et al. |
| 5,800,686 A | * | 9/1998 | Littau et al. ........... 204/298.07 |
| 5,817,406 A | | 10/1998 | Cheung et al. |
| 5,850,071 A | * | 12/1998 | Makiguchi et al. ......... 219/390 |
| 5,883,017 A | | 3/1999 | Tepman et al. |
| 5,911,896 A | * | 6/1999 | Holden et al. .............. 219/390 |
| 5,965,046 A | | 10/1999 | Franklin et al. |
| 6,037,574 A | * | 3/2000 | Ianham et al. .............. 219/544 |

OTHER PUBLICATIONS

"Thick Film Heaters on Stainless Steel Offer Thermal Uniformity and Fast Response," 1999 Watlow Electric Manufacturing Company.

* cited by examiner

Primary Examiner—Teresa Walberg
Assistant Examiner—Shawntina T. Fuqua
(74) Attorney, Agent, or Firm—Bozicevic, Field & Francis, LLP

(57) ABSTRACT

A heating chamber assembly for heating or maintaining the temperature of at least one wafer, employs thick film heater plates stacked at an appropriate distance to form a slot between each pair of adjacent heater plate surfaces. The heating chamber assembly may be employed adjacent one or more processing chambers to form a preheat station separate from the processing chambers, or may be incorporated in the load lock of one or more such processing chambers. The thick film heater plates are more efficient and have a better response time than conventional heat plates. A chamber surrounding the stack of heater plates is pressure sealable and nay include a purge gas inlet for supply purge gas thereto under pressure. A door to the chamber opens to allow wafers to be inserted or removed and forms a pressure seal upon closing. The slots in the stack are alignable with the door for loading and unloading of wafers. The stack is mounted on a drive shaft that extends through the chamber where it interfaces with a drive that traverses the drive shaft in and out of the chamber to align various slots as desired.

36 Claims, 6 Drawing Sheets

LOW PROFILE THICK FILM HEATERS IN MULTI-SLOT BAKE CHAMBER

FIELD OF THE INVENTION

The present invention relates to apparatus for preheating substrates prior to inserting them into a processing chamber for conducting a semiconductor manufacturing process step.

BACKGROUND OF THE INVENTION

Semiconductor processing chambers are used to provide process environments for the fabrication of integrated circuits and other semiconductor devices on wafers. Wafers are sequentially processed through a series of many different processing steps which include depositions of various layers (metal, insulator and dielectric) on the wafer, each of which may be followed by masking and etching process steps with or without planarization steps also being involved. By selective repetition of the deposition and processing of these layers, integrated circuits may be fabricated on the wafer or substrate.

Deposition and etching processes may be accomplished by various techniques, including various chemical vapor deposition (CVD) processes, physical vapor deposition (PVD) processes, such as sputtering, and plasma processes, to name a few. Most processing chambers used in conducting these processes include a vacuum chamber containing a wafer support member upon which the wafer is placed to be processed. A gas inlet having a mass flow controller, and a throttled exhaust coupled to a vacuum pump through a gate valve communicate with the vacuum chamber to provide the process gas flow and the vacuum conditions required for processing the wafer. A slit valve is provided in the vacuum chamber which allows access by a robot blade used to load the wafer on the wafer support for processing, as well as to remove the wafer from the wafer support and chamber after the process step has been completed.

Many such processes require elevated temperatures for best results. Although it is possible that the wafer support may start out at room temperature initially for processing of a first wafer, this is certainly not the usual case, since there is very little cooling of the wafer support, and certainly not cooling to room temperature during the time that a first wafer is removed and another wafer is loaded to be processed. When a wafer at room temperature is loaded onto a wafer support that is at operating temperature, a phenomenon has been observed where the wafer tends to "chatter" or "dance" on the wafer support initially after placement there. This phenomenon is believed to be caused when the pins, which support the wafer to allow the robot arm to slide out from between the wafer and wafer support, withdraw to allow the wafer to contact the wafer support. It is believed that cold (i.e., relative to the operating temperature) air is trapped between the wafer and wafer support, and as that air is heated it expands and causes the wafer to chatter as it escapes from between the wafer support and the wafer. This phenomenon, although observed with 200 mm wafer processing, was not as severe a problem as it has become with 300 mm wafer processing, where the chattering is much more pronounced, due to the larger surface area of the wafer, and this is likely to cause misalignment of and/or damage to the wafer.

One way of eliminating the chattering is to leave the wafer on the lift pins for a significant period of time (e.g., about 45 seconds) after placing it in the processing chamber to allow it to heat up prior to contacting it with the chuck. However, this additional time requirement seriously impacts the throughput of the processing. The chattering phenomenon can also be eliminated by preheating the wafers to a temperature significantly above room temperature, although they do not need to be heated all the way up to operating temperature. Such preheating also increases throughput in the processing chamber, since it then takes less time to get the wafer up to processing temperatures. A conventional heater may be used to preheat a wafer substrate. Conventional heaters are generally thick plates, having a thickness of at least 0.5" up to about 1", and are often made of cast aluminum or aluminum alloy and having a tube heater filament or embedded metal electrode running through the plate to heat the overall plate. A general idea of such construction can be gained from a reading of the description of the susceptor plate described in U.S. Pat. No. 5,633,073. Although the susceptor plate in the patent is described for use within a processing chamber, a similar construction can be used for preheating.

Conventional heaters have certain drawbacks including the fact that they are relatively thick and bulky, which limits their effectiveness if they are to be used in a stack arrangement for heating of multiple wafers simultaneously. This thickness also translates to a relatively large mass to be heated, and therefor the response time for initial heating up of the heater or changing the steady state temperature of a heater is relatively large (i.e., slow response time). Still further, conventional heaters are relatively heavy and expensive, costing on the order of $4,000 to $5,000 per heater plate.

In view of the foregoing, there remains a need for a heater system that has better response time, is more adaptable to stacked usage, and is less expensive.

SUMMARY OF THE INVENTION

A heating chamber assembly is provided with a stack of at least two thick film heater plates forming at least one slot configured to receive a wafer therein. A chamber surrounds the stack and has a door therethrough which opens to allow insertion of wafers and withdrawal of wafers from the assembly. Each slot is alignable with the door for receiving a wafer, or allowing a robot arm to access a wafer already in the slot and withdraw it.

Multiple slots can be provided by stacking enough thick film heater plates to form the desired number of slots. A slot is formed between two thick film heater plates, so that for "n" slots, "n+1" heater plates are required.

A drive shaft may be mounted to the stack, and the drive shaft extends through the chamber and engages a driver or motor which drives the drive shaft and stack for the purpose of aligning each of the slots with said door as desired. When the door is closed, it forms a pressure seal with the chamber. A sealing mechanism forms a pressure seal around the drive shaft and with the chamber, such that the chamber is capable of maintaining positive pressure. A gas inlet may be provided in the chamber, to enable the passing of a purge gas into the chamber to positively pressurize said chamber.

Each of the thick film heater plates comprises a pair of electrodes through which power is inputted to a resistive circuit to generate heat. A pair of supports underlies and supports each thick film heater plate in the stack, with one of each pair of supports aligning with the pair of electrodes on the respective thick film heater plate. The supports not only support the stack, but separate each adjacent pair of thick film heater plates to form the slots therebetween. The supports which align with the electrodes of the heater plates electrically interconnect the plates. Each of the electrically connecting supports includes a pair of electrodes for extending therethrough which align with and contact the electrodes in thick film heater plates on opposite sides thereof. An electrical power supply can than be connected at any location along the interconnected circuit of supports and heater plates, to supply power to the entire stack. Although the heater plates could be individually connected to separately controlled power supplies, such an arrangement is more expensive and cumbersome given the greater number of electrical line and power supplies that would be required, and as such is not considered as practical commercially.

The supports comprise a nonconducting material to prevent electrical conduction from the power source to any wafer in a slot. A nonconductive sleeve may surround a portion of each of the electrodes passing through the supports to further insulate the power from the wafers.

A controller may be provided to automatically and remotely control the chamber door led to open and close. The controller may also be connected with the driver or motor and the electric power supply to control their functions.

At least one thermocouple may be provided within the chamber and electrically connected to the controller to provide feedback regarding a temperature inside of the chamber. A more preferred arrangement is to provide three thermocouples 78, 80, 82, one probing the top heater plate, one probing the bottom heater plate, and one probing the middle heater plate or one of a pair of heater plates nearest the middle of the stack if an even number of heater plates is employed. The middle thermocouple is used to provide feedback for temperature control purposes. The top and bottom thermocouples are used for comparison with the reading generated by the middle thermocouple. If a difference between the reading from the middle thermocouple and either one or both of the top and bottom thermocouples becomes more than a predetermined amount, this is an indicator of an operational problem, at which time the operation would be shut down.

Further, a sensor may be mounted on the chamber to detect when a wafer has been placed out of position in the chamber, and the sensor may be electrically connected to the controller to input a message to the controller when a misaligned wafer has been detected.

A heater subassembly for a wafer heating chamber is provided which includes a stack of thick film heater plates electrically interconnected with one another and defining slots therebetween. The slots are dimensioned for receiving wafers. At least a pair of supports are positioned between each pair of interfacing surfaces of the plates.

A support base may be provided to underlie the bottom thick film heater plate of the stack, to further support the stack. A drive shaft extending from the bottom of the stack or support base and is adapted to be driven to traverse the stack.

The supports comprise nonconductive blocks, at least a portion of which have a thickness that defines a height of the slots. Another portion of each nonconductive block is thinner than the thickness defining the height of the slots and forms a portion of a pedestal adapted to support a wafer.

The supports may include spring loaded connectors in combination with a rigid shaft passing therethrough.

These and other objects, advantages, and features of the invention will become apparent to those persons skilled in the art upon reading the details of the heat chamber assemblies and subassemblies as more fully described below.

DETAILED DESCRIPTION OF PREFERRED EMBODIMENTS

Before the present invention is described, it is to be understood that this invention is not limited to particular examples or embodiments described, as such may, of course, vary. It is also to be understood that the terminology used herein is for the purpose of describing particular embodiments only, and is not intended to be limiting, since the scope of the present invention will be limited only by the appended claims.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "and", and "the" include plural referents unless the context clearly dictates otherwise. Thus, for example, reference to "a capacitor" includes a plurality of such capacitors reference to "the layer" includes reference to one or more layers and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Figure 1:
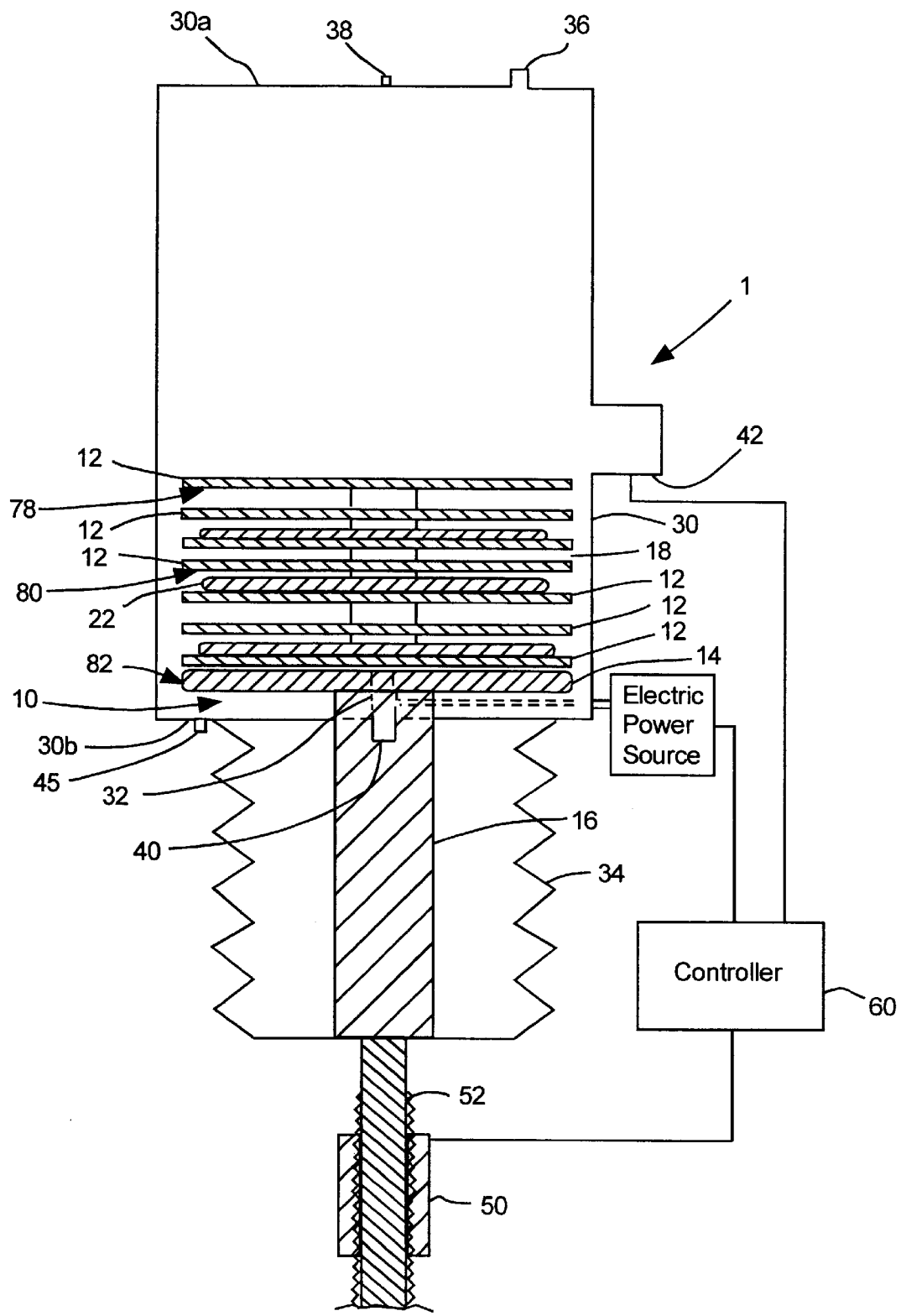
FIG. 1 is a diagrammatic sectional view of a heater according to the present invention.
Figure 8:
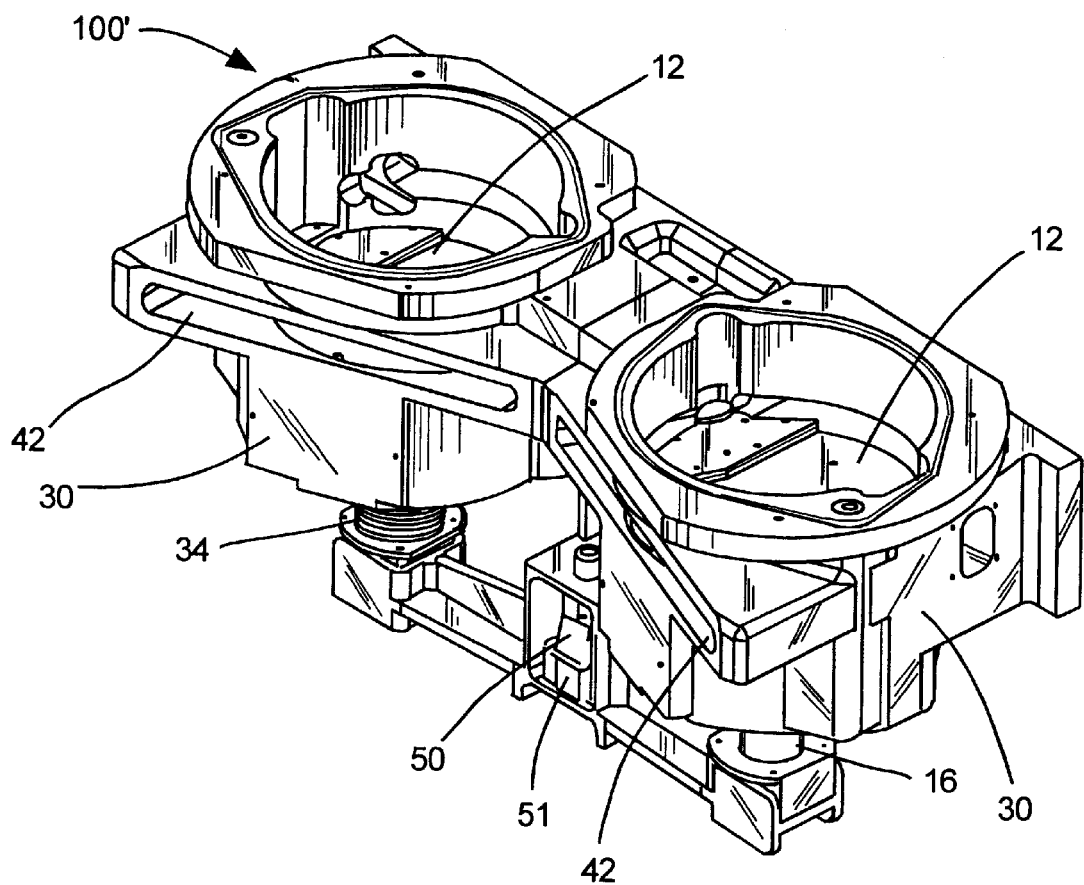
FIG. 8 is a perspective view of a dual chamber heater assembly, absent a top plate.

Referring now to the figures, wherein like reference characters denote like or corresponding parts throughout the views, examples of the present invention are explained. The major components of a heater 1 according to the present invention are diagrammatically illustrated in the sectional view of FIG. 1. Heater 1 includes a bake chamber assembly 10 that is movably mounted within a heater chamber 30. Bake chamber 30 is pressure sealed and may be formed of cast aluminum (preferably Al 6061 T6). Preferably a block of cast aluminum is machined to form a twin heater chamber, as shown in FIG. 8, for receiving a pair of side by side stacked heater plates, although a single chamber, such as chamber 30 in FIG. 1 can be machined similarly. Aluminum is a preferred material, since it has good heat transfer properties, is easy to machine, and contains no nickel which could be attacked and corroded by $O_3$. Aluminum is also chemically compatible with other processing gases used in the related processes that the present invention is to be used for. The chamber is preferably a single piece, as noted above. A top plate 30a seals against the chamber 30.

A bake chamber according to the present invention may be formed to assume a position where one of a plurality of processing chambers would otherwise reside, for use in a multichamber system such as The Producer, available from Applied Materials, Santa Clara, Calif. As noted above, a bake chamber may be similarly arranged for use in conjunction with a single processing chamber. In yet another arrangement, a heating or bake chamber assembly may be incorporated into a load lock of one or more processing chambers, for direct preheating in the load lock.

The bake chamber assembly 10 includes a plurality of thick film heater plates 12 mounted in a stack on support plate 14. Support plate 14 is mounted on drive shaft 16. Support plate 14 and drive shaft 16 may be formed of aluminum (Al 6061 T6), for example. The support plate 14 and heater plates 12 are dimensioned to be freely slidable within chamber 13. The bake chamber assembly 10 is assembled within the chamber 30 with drive shaft 16 passing through opening 32 in the bottom 30b of chamber 30. A flexible sealing member 34, e.g., a bellows or other sealing member, is secured to the bottom 30b to surround the entire perimeter of the hole 32 and to form a pressure seal with the bottom 30b. The flexible sealing member also encapsulates the drive shaft 16, or at least forms a pressure seal with the bottom of the drive shaft 16, so that the drive shaft can traverse in and out of the chamber 30 with no loss of pressure within the chamber 30.

The top lid 30a of the chamber includes a gas inflow valve 36 through which nitrogen or other purging gas (such as helium or oxygen, for example) is inputted to pressurize the chamber, which is generally pressurized to about 700±50 Torr at the bake pressure. Pressurization of the chamber insures a positive pressure always exists during heating processes, so that when a wafer is placed into or removed from the chamber, there is an outflow of the purge gas which prevents possible inflows of contaminants. Also, the pressurized purge gas increases the efficiency of heat transfer within the chamber. A sensor 38, which may be an infrared transmitter or other optical type of sensor, is also provided in the top lid 30a and is aligned with holes in the supports interconnecting the heater plates 12. In the case of an infrared transmitter 38, an infrared receiver 40 is aligned therewith on the bottom 30b of the chamber. This sensor system is used to detect when a wafer is out of alignment with its intended position in the heater, and is discussed in more detail below.

A motor 50 having an extendable and retractable motor drive shaft 52 is provided for traversing the bake chamber assembly. The motor is actuated and controlled by a computer controller 60 so that motor drive shaft 52 engages the drive shaft 16 and extends to raise the position of the bake chamber assembly 10 with respect to the chamber 30, while retracting to lower the position of the bake chamber assembly 10 relative to the chamber 30. In the configuration of FIG. 8, the motor 50 is mounted in the lift bracket 51, to simultaneously actuate both bake chamber assemblies. The motor 50 may be a stepper motor, such as a five phase stepper motor available from Oriental Motors, 291 Beach Road, Singapore, where precise positioning of the bake chamber assembly can be controlled by the stepper motor without the need for any additional position sensor. Alternatively, other motors or drivers may be employed along with a position sensor that may be placed on the motor drive shaft 52 or drive shaft 16, or anywhere else on the movable bake chamber assembly, with feedback to the controller 60, which would then control inputs to the motor 50 for precise positioning of the bake chamber assembly 10.

The chamber 30 includes a robot door 42, which may be a remotely controlled slit valve or the like as is generally known in the art. The robot door 42 is controlled by controller 60 to open to allow an insertion or removal of a wafer, and then to close after that operation is complete, to reseal the chamber 30 and allow the purge gas to repressurize the interior of the chamber 30.

Figure 2:
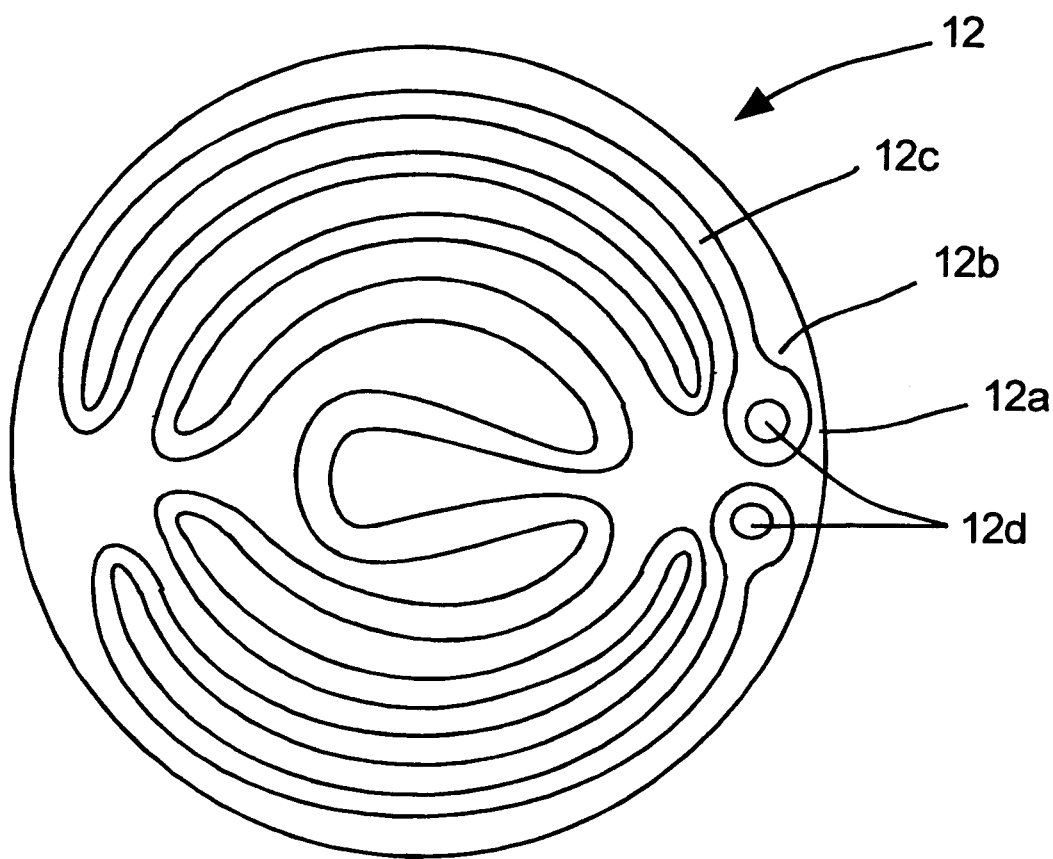
FIG. 2 is top view of an example of a thick film heater plate used in a heater according to the present invention.

Turning to FIG. 2, a top view of a thick film heater plate 12 is shown. Heater plate 12 includes a substrate or plate 12a that forms the base of the plate. A thick film heater 12b is printed on the plate 12a to form the thick film heater plate. (Thick film heaters are available from Watlow Industries, Hannibal Missouri). The thick film heater 12b includes an electrically resistive circuit which covers a substantial portion of the surface of the plate 12a, and a pair of electrodes 12d connected to the circuit 12c, which are adapted to connect with a power source. Since no embedding or additional layer to house a tube type of electrode is required with this arrangement, the thick film heater plates can be manufactured about one order thinner than conventional heater plates. For example, conventional aluminum or ceramic heater plates are generally on the order of greater than 0.50" and usually at least around 0.7" thick. In contrast, thick film heater plates for purposes of this invention can be produced having a thickness of less than 0.5" and typically about 0.125" and thinner. For heating applications at about 400° C., the thickness may be as little as about 0.08", and for heating at about 200° C., the thick film heater plates 12 may be even thinner, as thin as about 0.05".

The fact that the thick film heater plates 12 are substantially thinner than conventional heater plates results in several advantages of the present invention over conventional bake chambers. Being one order thinner also translates into a one order smaller heat mass. Thus, the response time for temperature control and temperature changes is much faster than that of ordinary heater plates. Also, the heat loss and power consumption of thick film heater plates 12 is substantially lower than conventional heater plates. This leads to a reduction in the cost of production, increased throughput, and less energy consumption. Thick film heaters can be printed on many different substrates, including, but not limited to, stainless steel, aluminum, alumina, ceramics, quartz, etc. This increases design flexibility in the ability to meet different temperature and chemical compliance requirements.

Since the thick film heater plates 12 are substantially thinner than conventional heater plates, more of them can be stacked in the same chamber than could conventional plates, thereby providing an increased number of slots 18 to receive wafers 22 and increasing throughput. For example, a chamber that can contain enough conventional heater plates to form only three slots can contain enough thick film heater plates to form six slots. On a slot to slot comparison (a slot is a compartment for receiving a wafer, formed by stacking one heater plate on top of another) a stack of thick film heater plates has a much lower height and the distance between slots is much smaller, compared to the conventional arrangement. This reduces the travel requirements for the drive mechanism required to align each slot with the robot door. The result is increased accuracy, for any time the drive is out of alignment in the least, the degree of misalignment is amplified as the travel distance increases. Additionally, a shorter travel drive unit is less space consuming and less expensive to produce than what is needed for the conventional arrangement. Also, the elongation requirements of the bellows 34 are less stringent, reducing the number of folds in the bellows needed, thereby reducing the opportunity for failure of this component. The lower mass of the thick film heater plates lowers the amount of power required for the motor/driver 50, which also lowers costs. The cost of producing a thick film heater plate itself is significantly lower than the cost of a conventional heater plate, costing around $1,000 or less compared to $4,000–$5,000 for a conventional heater plate.

Figure 3:
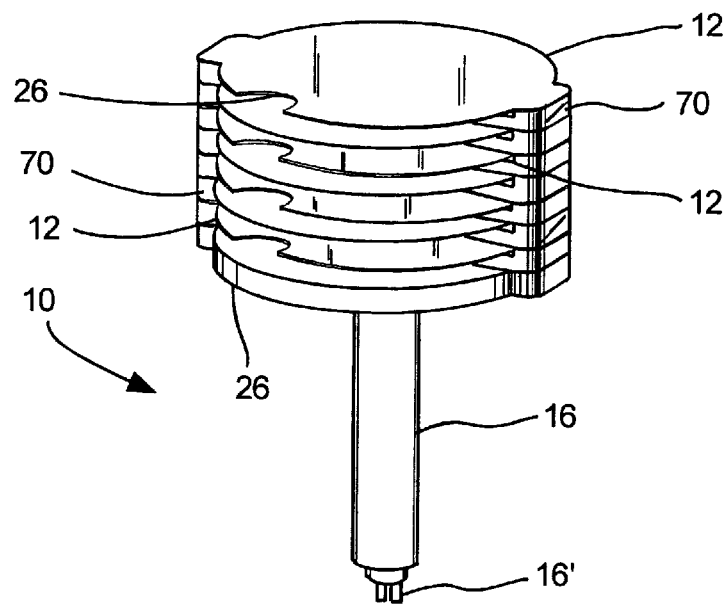
FIG. 3 is an isolated, perspective view of a bake chamber assembly isolated from the chamber of the heater.

FIG. 3 is an isolated, perspective view of a bake chamber assembly 10 isolated from the chamber of the heater. The thick film heater plates 12 are stacked one on top of another and interconnected by supports 70, which may be ceramic iso blocks, or other substantially non-conductive and structurally supporting material. The thickness of the supports 70 establishes a slot 18 in between each adjacent pair of thick film heater plates for receiving a wafer therebetween. A heater base 16' is provided at the free end of drive shaft 16 for engaging the drive shaft 52 of the drive motor 50. Although an arrangement of seven thick film heater plates 12 is shown (thereby forming six slots 18), it is noted that the present invention is not limited to such number, as fewer or greater numbers of thick film heater plates can be stacked in a bake chamber assembly 10 to form the desired number of slots. A cutout 26 is provided in each thick film heater plate 12 to facilitate the circulation of the purge gas through the chamber. The cutouts 26 are preferably arranged in an alternating manner, such that a cutout 26 of any plate 12 appears on an opposite side (e.g., is diametrically opposed) to the cutouts 26 of the plates 12 immediately adjacent it. This type of arrangement acts to direct the flow of the purge gas across the surfaces of the plates 12 (and thus also any wafers 22 in slots 18), forming a much more effective purge.

Figure 4:
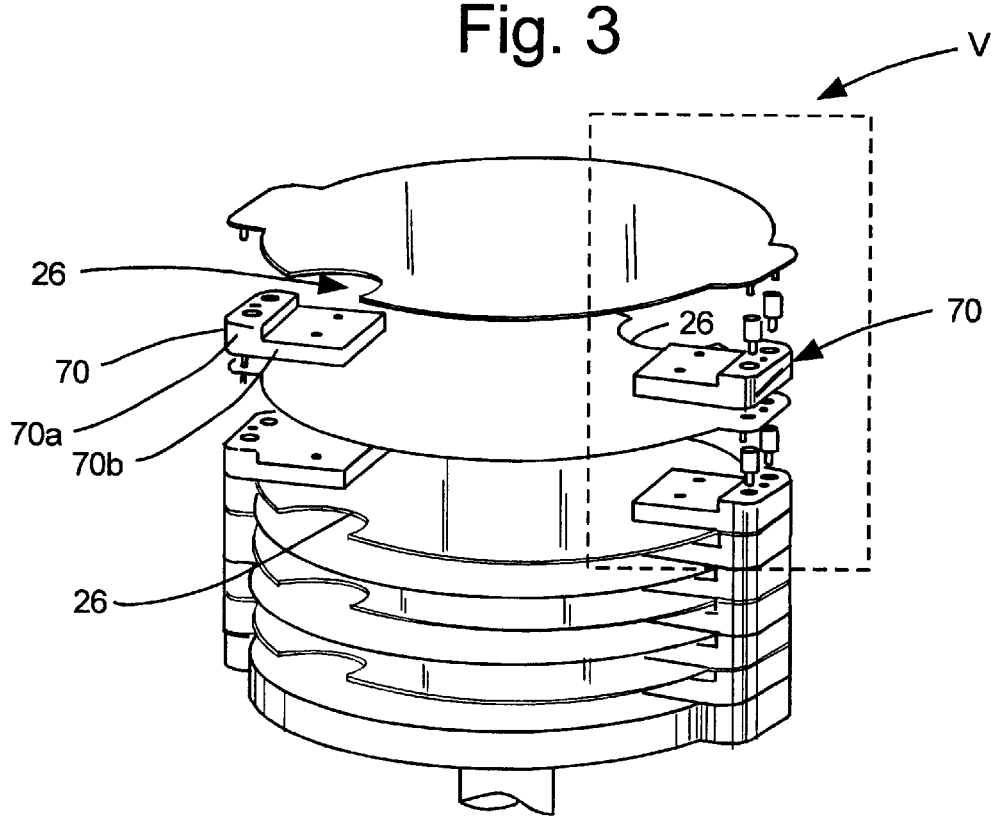
FIG. 4 is a partially exploded view of a bake chamber assembly, absent the drive shaft.

FIG. 4 is a partially exploded view of a bake chamber assembly 10, absent the drive shaft 16. Supports 70 are formed in a stepped, or "L-shaped" design, where the thicker portion 70a of the support contacts thick film heater plates 12 on both sides and establishes the spacing between the plates 12 to form the slots 18. The thinner portion 70b of each support 70 forms a support or pedestal 70b upon which the wafer 22 is supported when it is inserted into the slot 18. This maintains the wafer 22 out of direct contact with the underlying heater plate 12 and at a desired distance between both heater plates 12 above and below the wafer so that heating and temperature control operations are much more consistent and are applied through convection and radiant heat, rather than a direct heat transfer. Another benefit is that a pin lift system is not needed to raise the wafer to allow access by the robot blade, as the pedestal supports 70b leave enough space underlying the wafer to allow the robot blade to access the slot and then pick the wafer 22 off the pedestal supports 70b, and remove the wafer through the robot door 42, without the need for any mechanism to lift the wafer for access clearance. Conversely, the robot arm can also insert a wafer 22 into a slot 18 (after having gained access through robot door 42), lower the wafer 22 onto the pedestal supports, thereby separating contact between the robot arm and wafer 22, and withdraw from the chamber through the robot door, again without any need for a mechanism to receive the wafer 22 and lower it onto a support.

Figure 5:
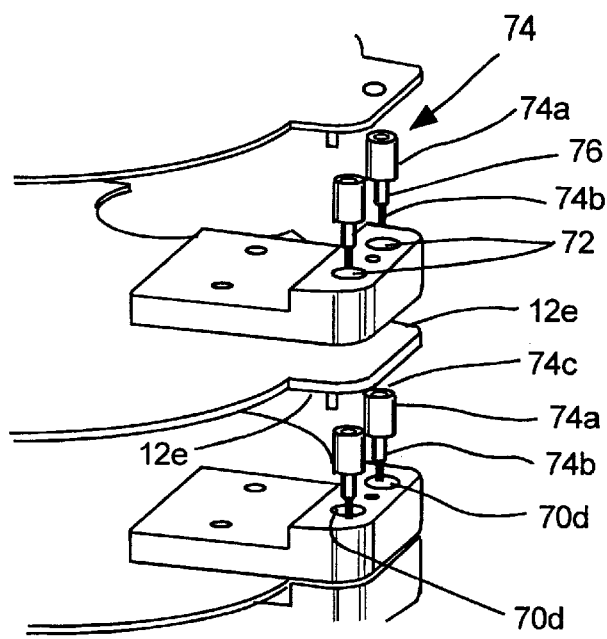
FIG. 5 is an exploded partial view of a bake chamber assembly showing electrical connections between the thick film heater plates.

FIG. 5 is a blown up partial view of the bake chamber assembly in FIG. 4, showing the area outlined in FIG. 4, V. An assembly which provides the electrical connections between the thick film heater plates 12 is shown. Bores 72 are provided in the insulating supports 70 and are dimensioned to receive terminals 74 with a close fit. Terminals 74 may be formed of copper or other relatively good conducting metal or material which is also nonreactive in the environment for which it is designed. The large diameter end 74a lies substantially flush with the surface of the support 70, or extends minimally therefrom, to contact a terminal 12d of a thick film heater plate when is assembled on top of the supports 70. An insulator sleeve 76 fits over a portion of the reduced diameter part 74b of terminal 74 to continue the insulation provided by supports 70. The end portion of the reduced diameter part 74b extends beyond the insulator sleeve and is dimensioned for a close, contacting fit with bore 74c provided in the large diameter end 74a (of another terminal 74). Thus, the terminals form a continuous, electrically conducting column when assembled upon one another, by the contact provided between a reduced diameter end 74b of an overlying terminal 74, with a large diameter end 74a of an underlying terminal 74 via bore 74c. This "peg in hole" interfit at the same time provides lateral structural support to the stack. Upon assembly of the entire stack, the plates are further secured together using a conventional clamping mechanism. For example, a rod can be passed through each side of the stack and a wave washer can be applied against the plates at both (or only one of) the top and bottom of the stack, with a nut or other compression fixture applying a clamping pressure against the wave washer(s) to maintain a compressive force against the plates and supports to maintain them as a unit.

Alternatively, the thick film heater plates may be provided with Luvatech™ connectors (available from AMP, Cupertino, Calif.) fixed to terminals 12d. This type of an arrangement allows easy assembly of the stack, as the Luvatech connectors are spring loaded and clamp to an electrically conductive rod that can be passed through the connectors to form the stack. This way, one or more heater plates may be added, removed or exchanged without dismantling the entire stack.

Figure 6:
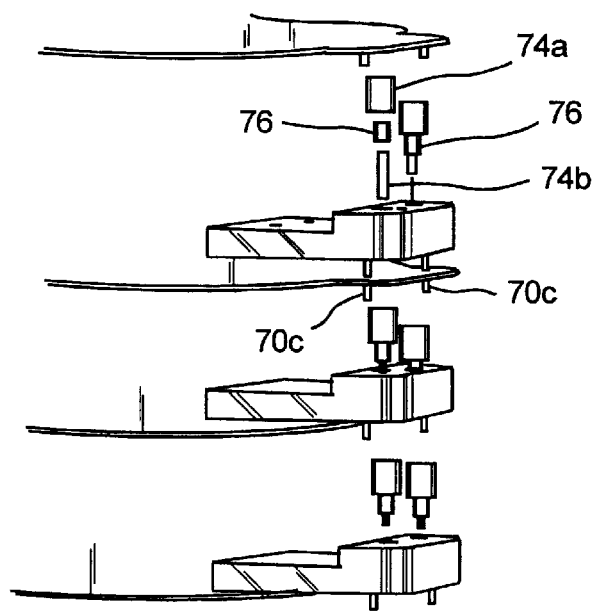
FIG. 6 is an exploded partial view of a bake chamber assembly detailing electrical connection components between the thick film heater plates.

FIG. 6 is a further exploded partial view of a bake chamber assembly which shows that the supports 70 are provided with pegs 70c, extending from the bottom surface of the support, that are dimensioned to pass through holes 12e in plates 12 and interfit with holes 70d in an underlying support 70 (or, in the case of the supports 70 which sit directly on the support plate 14, in holes provided in the support plate 14 (not shown) to provide further structural stability as well as to insure proper placement of the plates 12 with respect to the supports 70.

Figure 7:
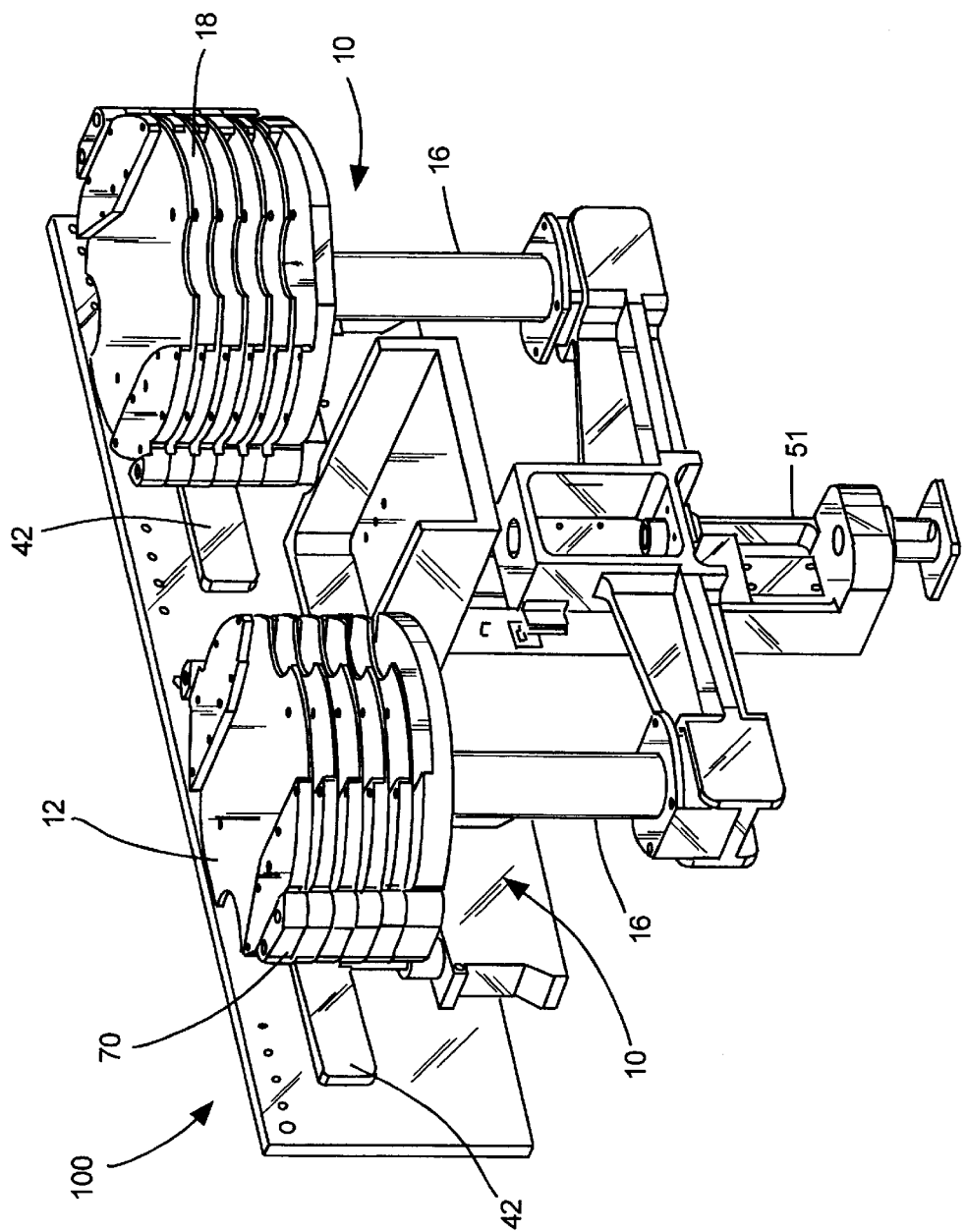
FIG. 7 is a partial assembly view of a dual chamber heater assembly, absent the chambers.

FIG. 7 is a partial assembly view of a dual chamber heater assembly 100, absent the chambers. The construction of the bake chamber assemblies 10 is essentially the same as that described above, however, two assemblies are ganged together in this arrangement, so that a single robot having a pair of arms can service twice as many process chambers in tandem, for increased production. A single drive motor 50 is mounted in lift bracket 51 for raising a lowering the pair of stack assemblies in tandem. Each chamber is provided with a robot door 42 for access thereto to input and extract substrates. Although not shown, a single controller may be connected to both bake chamber assemblies for the tandem operation thereof. Of course, separate and independent controllers, motors and robots could be provided, if one so desired, although it would be commercially less cost effective.

FIG. 8 is a perspective view of a dual chamber heater assembly 100', absent a top plate. The assembly 100' varies slightly from assembly 100 in design, in that the robot doors 42 are oriented at a slight angle to one another. Both bake or heater chambers 30 are pressure controlled by a single pump input which normalizes the pressure in both chambers. The two chamber are preferably machined from a single block of aluminum to form the two assembly, "ganged" unit. Only one bellows 34 is shown in FIG. 8, for contrast with the drive shaft 16, shown without the bellows. Of course, each drive shaft, during operation, would be surrounded by a bellows 34 or other flexible sealing mechanism.

The following example is put forth so as to provide those of ordinary skill in the art with a complete disclosure and description of how to make and use the present invention, and is not intended to limit the scope of what the inventors regard as their invention nor is it intended to represent that the arrangement below is the only arrangement experimented with. Efforts have been made to ensure accuracy with respect to numbers used (e.g. amounts, temperature, etc.) but some experimental errors and deviations should be accounted for. Unless indicated otherwise, parts are parts by weight, molecular weight is weight average molecular weight, temperature is in degrees Centigrade, and pressure is at or near atmospheric.

EXAMPLE

A multi-slot bake chamber is assembled with a stack of seven thick film heater plates, separated by six sets of supports to form six slots. Another set of supports separates the bottom thick film heater plate from a support base which is mounted to a drive shaft that extends through the chamber. A remotely controlled robot arm is provided to access each of the slots as the slots are aligned, via a motor and the drive shaft, with a robot door in the chamber. The controller opens the door to allow such access. Three processing chambers (in this example, CVD chambers) are also accessible by the robot arm. Therefor the robot arm can move wafers between any of the three processing chambers and the bake chamber.

Six wafers, originally at room temperature (e.g., about 25° C.) are loaded into the bake chamber, which has been set to heat to about 300° C. After a period of less than or equal to about 30 seconds, the wafers will have achieved a steady state temperature of about 300° C. and can be further processed. The robot door is opened and the robot arm is activated to remove a wafer from the bake chamber and transfer it to one of the CVD chambers. The same process is carried out for the other two CVD chambers which may be programmed to perform the same process step, or a different process step from the first CVD chamber. The chambers use a process temperature of about 480° C. in this example. When the wafers are placed on the chucks of the CVD chambers, they come to rest stably in their intended positions, and do not "dance" because the wafers are already in a preheated state.

Upon completion of a process step in one of the CVD chambers, the robot arm is activated to remove the wafer from the CVD chamber and return it to an empty slot in the bake chamber, where it will await further processing, or from where it can be removed after it has returned to about 300° C. Because the bake chamber has six slots, it will always have another wafer ready for processing in the CVD chamber from which it receives a wafer, thereby greatly enhancing throughput of the CVD chambers.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A heating chamber assembly for heating or maintaining the temperature of at least one wafer, said assembly comprising:
  a chamber capable of completely enclosing the at least one wafer;
  a door in said chamber, capable of opening to allow insertion of a wafer into said chamber or withdrawal of a wafer from said chamber; and
  a stack of at least two thick film heaters, each thick film heater consisting essentially of one plate, an electrical resistive circuit thereon and electrodes connected to said circuit, said stack forming at least one slot configured to receive a wafer therein, said at least one slot being alignable with said door.

2. The assembly of claim 1, wherein said at least two thick film heater plates comprises at least three thick film heaters forming at least two of said slots, said stack being mounted to a drive shaft extending through said chamber; and
  a motor operatively connected to said drive shaft to traverse said drive shaft in and out of said chamber for the purpose of aligning various ones of said slots with said door.

3. The assembly of claim 2, further comprising a sealing mechanism forming a pressure seal around said drive shaft and with said chamber, wherein said chamber is capable of maintaining positive pressure.

4. The assembly of claim 1, further comprising a gas inlet in said chamber, said gas inlet operable to pass a purge gas into said chamber to positively pressurize said chamber.

5. The assembly of claim 1, wherein each of said thick film heaters comprises a pair of electrodes, said assembly further comprising a pair of supports underlying and supporting each said thick film heater, one of each said pair of supports aligning with said pair of electrodes on the respective thick film heater.

6. The assembly of claim 1, further comprising a pair of supports separating each adjacent pair of said at least two thick film heaters, said pair of supports establishing a gap between said thick film heaters to form said slot between said heaters.

7. The assembly of claim 6, wherein each said pair of supports having a pair of electrodes extending therethrough which align with and contact said electrodes of said thick film heater plates.

8. The assembly of claim 7, further comprising an electrical power supply connected to said thick film heater plates via said electrodes interconnecting said supports and said thick film heaters.

9. The assembly of claim 7, wherein said supports comprise a nonconducting material.

10. The assembly of claim 9, wherein said supports are ceramic.

11. The assembly of claim 7, further comprising a nonconductive sleeve surrounding a portion of each said electrodes passing through said supports.

12. The assembly of claim 2, wherein said at least three thick film heaters comprise seven thick film heaters defining six of said slots.

13. The assembly of claim 2, further comprising an electric power supply connected to each said thick film heater for supplying electric power thereto to generate heat.

14. The assembly of claim 13, further comprising:
a controller electrically connected with said motor to control the operation thereof; and
a sensor adapted to detect when a wafer has been placed out of position in said chamber, said sensor being electrically connected to said controller to input a message to said controller when a misaligned wafer has been detected.

15. A heater subassembly for a wafer heating chamber, said heater subassembly comprising:
a stack of thick film heaters electrically interconnected with one another and defining slots therebetween, said slots dimensioned for receiving wafers said thick film heater consisting essentially of one plate, an electrically resistive circuit thereon and electrodes connected to said circuit; and
at least a pair of supports positioned between each pair of interfacing surfaces of said plates.

16. The heater subassembly of claim 15, further comprising, a support base underlying a bottom thick film heater plate of said stack and supporting said stack; and
a drive shaft extending from said support base and adapted to be driven to traverse said stack.

17. The heater subassembly of claim 15, wherein said supports comprise nonconductive blocks, at least a portion of which have a thickness that defines a height of said slots.

18. The heater subassembly of claim 17, wherein another portion of each said nonconductive block is thinner than said thickness defining the height of the slots and forms a portion of a pedestal adapted to support a wafer.

19. A multi-slot heating chamber assembly for heating or maintaining the temperature of wafers, said assembly comprising:
a chamber capable of completely enclosing the wafers;
a door in said chamber, capable of opening to allow insertion of a wafer into said chamber or withdrawal of a wafer from said chamber; and
a stack of at least three heater plates forming at least two slots configured to receive wafers therein, each of said slots being alignable with said door and each said plate having a thickness less than about 0.5".

20. The assembly of claim 19, wherein each said plate has a thickness less than or equal to about 0.125" and greater than about 0.05".

21. The assembly of claim 19, wherein each said heater plate comprises a thick film heater plate.

22. The assembly of claim 19, further comprising forming a drive shaft mounted to said stack and extending through said chamber; and
a motor operatively connected to said drive shaft to traverse said drive shaft in and out of said chamber for the purpose of aligning various ones of said slots with said door.

23. The assembly of claim 22, further comprising a gas inlet in said chamber, said gas inlet operable to pass a purge gas into said chamber to positively pressurize said chamber.

24. The assembly of claim 23, wherein each said heater plate comprises a cutout that facilitates circulation of said purge gas.

25. A multi-slot heating chamber assembly for heating or maintaining the temperature of wafers, said assembly comprising:

a chamber capable of completely enclosing the wafers;
a door in said chamber, capable of opening to allow insertion of a wafer into said chamber or withdrawal of a wafer from said chamber; and
a stack of at least three heater plates forming at least two slots configured to receive wafers therein, each of said slots being alignable with said door and each said plate comprises a thick film heater plate having a thickness less than or equal to about 0.125".

26. A multi-slot twin heating chamber assembly for heating or maintaining the temperature of wafers, said assembly comprising:
a pair of chambers capable of completely enclosing the wafers;
a door in each said chamber, capable of opening to allow insertion of a wafer into said respective chamber or withdrawal of a wafer from said respective chamber; and
a pair of stacks of at least three heater plates each forming at least two slots configured to receive wafers therein, each of said slots being alignable with said respective door and each said plate comprises a thick film heater plate having a thickness less than or equal to about 0.125".

27. A system for processing semiconductor wafers, said system comprising:
at least one processing chamber adapted to provide a processing environment for the conduction of at least one semiconductor manufacturing process step on the wafers; and
a multi-slot heating chamber assembly for heating or maintaining the temperature of the wafers when the wafers are not in said at least one processing chamber, said assembly comprising:
a chamber capable of completely enclosing the wafers;
a door in said chamber, capable of opening to allow insertion of a wafer into said chamber or withdrawal of a wafer from said chamber; and
a stack of at least three heater plates forming at least two slots configured to receive wafers therein, each of said slots being alignable with said door and each said plate comprises a thick film heater plate having a thickness less than or equal to about 0.125".

28. A system for processing semiconductor wafers, said system comprising:
at least one processing chamber adapted to provide a processing environment for the conduction of at least one semiconductor manufacturing process step on the wafers; and
a load lock capable of providing a sealed environment with said at least one processing chamber, said load lock comprising a multi-slot heating chamber assembly for heating or maintaining the temperature of the wafers when the wafers are not in said at least one processing chamber, said assembly comprising a stack of at least three heater plates forming at least two slots configured to receive the wafers therein, each said plate comprising a thick film heater plate having a thickness less than or equal to about 0.125".

29. A heating chamber assembly for heating or maintaining the temperature of at least one wafer, said assembly comprising:
a chamber capable of completely enclosing the at least one wafer,
a door in said chamber, capable of opening to allow insertion of a wafer into said chamber or withdrawal of a wafer from said chamber, a stack of at least two thick film heater plates forming at least one slot configured to receive a wafer therein, said at least one slot being alignable with said door, and a pair of supports separating each adjacent pair of said at least two thick film heater plates, said pair of supports establishing a gap between said thick film heater plates to form said slot between said heater plates, wherein said thick film heater plates comprise a pair of electrodes for supplying electric power thereto and one of each said pair of supports having a pair of electrodes extending therethrough which align with and contact said electrodes in said thick film heater plates.

30. The assembly of claim 29, further comprising an electrical power supply connected to said thick film heater plates via said electrodes interconnecting said supports and said thick film heater plates.

31. The assembly of claim 29, wherein said supports comprise a nonconducting material.

32. The assembly of claim 31, wherein said supports are ceramic.

33. The assembly of claim 29, wherein said at least two thick film heater plates comprises seven thick film heater plates defining six of said slots, said stack being mounted to a drive shaft extending through said chamber, a motor being operatively connected to said drive shaft to traverse said drive shaft in and out of said chamber for the purpose of aligning various ones of said slots with said door.

34. A heater subassembly for a wafer heating chamber, said heater subassembly comprising:

a stack of thick film heater plates electrically interconnected with one another and defining slots therebetween, said slots dimensioned for receiving wafers, at least a pair of supports positioned between each pair of interfacing surfaces of said plates, wherein said supports comprise nonconductive blocks, at least a portion of which have a thickness that defines a height of said slots, and wherein another portion of each said nonconductive block is thinner than said thickness defining the height of the slots and forms a portion of a pedestal adapted to support a wafer.

35. A multi-slot heating chamber assembly for heating or maintaining the temperature of wafers, said assembly comprising:

a chamber capable of completely enclosing the wafers;

a door in said chamber, capable of opening to allow insertion of a wafer into said chamber or withdrawal of a wafer from said chamber; and a stack of at least three heater plates forming at least two slots configured to receive wafers therein, each of said slots being alignable with said door and each said plate having a thickness less than or equal to about 0.125" and greater than about 0.05".

36. A multi-slot heating chamber assembly for heating or maintaining the temperature of wafers, said assembly comprising:

a chamber capable of completely enclosing the wafers;

a door in said chamber, capable of opening to allow insertion of a wafer into said chamber or withdrawal of a wafer from said chamber, a stack of at least three heater plates forming at least two slots configured to receive wafers therein, each of said slots being alignable with said door and each said plate having a thickness less than about 0.5", a drive shaft mounted to said stack and extending through said chamber, a motor operatively connected to said drive shaft to traverse said drive shaft in and out of said chamber for the purpose of aligning various ones of said slots with said door, and a gas inlet in said chamber, said gas inlet operable to pass a purge gas into said chamber to positively pressurize said chamber, wherein each said heater plate comprises a cutout that facilitates circulation of said purge gas.

* * * * *